United States Patent
Yang

(10) Patent No.: US 9,343,010 B2
(45) Date of Patent: May 17, 2016

(54) GAMMA REFERENCE VOLTAGE GENERATING CIRCUIT AND DISPLAY DEVICE INCLUDING THE SAME

(71) Applicant: LG Display Co., Ltd., Seoul (KR)

(72) Inventor: Yeunhyeok Yang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/290,792

(22) Filed: May 29, 2014

(65) Prior Publication Data

US 2015/0187263 A1 Jul. 2, 2015

(30) Foreign Application Priority Data

Dec. 31, 2013 (KR) .................. 10-2013-0169471

(51) Int. Cl.
*G09G 3/32* (2006.01)
*G09G 3/20* (2006.01)
*H03M 1/78* (2006.01)

(52) U.S. Cl.
CPC ............ *G09G 3/3216* (2013.01); *G09G 3/2011* (2013.01); *G09G 3/3291* (2013.01); *H03M 1/785* (2013.01); *G09G 2310/027* (2013.01); *G09G 2310/0291* (2013.01); *G09G 2320/0276* (2013.01); *G09G 2320/0673* (2013.01); *G09G 2330/025* (2013.01); *G09G 2330/028* (2013.01)

(58) Field of Classification Search
None
See application file for complete search history.

(56) References Cited

U.S. PATENT DOCUMENTS

| | | | | |
|---|---|---|---|---|
| 6,784,861 | B2 * | 8/2004 | Okada | ............................. 345/87 |
| 7,079,127 | B2 * | 7/2006 | Morita | .......................... 345/212 |
| 8,836,733 | B2 * | 9/2014 | Lee et al. | ....................... 345/690 |
| 2002/0145600 | A1 * | 10/2002 | Morita | .......................... 345/211 |
| 2003/0151578 | A1 * | 8/2003 | Morita | ............................ 345/89 |
| 2005/0007393 | A1 | 1/2005 | Akai et al. | |
| 2007/0013621 | A1 * | 1/2007 | Lee et al. | ......................... 345/82 |
| 2007/0120805 | A1 | 5/2007 | Yi | |
| 2007/0146395 | A1 | 6/2007 | Lee | |
| 2007/0195047 | A1 * | 8/2007 | Cho | ................................ 345/98 |
| 2008/0122814 | A1 * | 5/2008 | Shin et al. | ...................... 345/204 |

(Continued)

FOREIGN PATENT DOCUMENTS

EP 1 335 346 A1 8/2003
JP 2013-068915 A 4/2013

OTHER PUBLICATIONS

European Patent Office, Search Report, European Patent Application No. 14180239.7, Apr. 13, 2015, seven pages.

(Continued)

*Primary Examiner* — David D Davis
(74) *Attorney, Agent, or Firm* — Fenwick & West LLP

(57) ABSTRACT

A gamma reference voltage generating circuit and a display device including the same are disclosed. The gamma reference voltage generating circuit includes a first voltage follower which receives a first reference voltage generated by a first digital-to-analog converter and outputs a first gamma reference voltage, an nth voltage follower which receives a second reference voltage generated by a second digital-to-analog converter and outputs an nth gamma reference voltage, where n is a natural number equal to or greater than 3, a resistor string for dividing the first gamma reference voltage and the nth gamma reference voltage, and second to (n−1)th voltage followers which receives the first gamma reference voltage and the nth gamma reference voltage divided by the resistor string and outputs second to (n−1)th gamma reference voltages.

17 Claims, 8 Drawing Sheets

(56) References Cited

U.S. PATENT DOCUMENTS

| | | | |
|---|---|---|---|
| 2008/0136761 A1* | 6/2008 | Hong et al. | 345/89 |
| 2009/0051575 A1 | 2/2009 | Lee et al. | |
| 2010/0007639 A1* | 1/2010 | Jeong et al. | 345/208 |
| 2010/0007680 A1 | 1/2010 | Yu et al. | |
| 2010/0225678 A1 | 9/2010 | Kim et al. | |
| 2012/0162208 A1* | 6/2012 | Park et al. | 345/419 |
| 2012/0162272 A1* | 6/2012 | Lee et al. | 345/690 |
| 2013/0147781 A1* | 6/2013 | Kim et al. | 345/211 |
| 2013/0147861 A1* | 6/2013 | Kim et al. | 345/690 |
| 2015/0170609 A1* | 6/2015 | Jung | 345/212 |

OTHER PUBLICATIONS

European Extended Search Report, European Application No. 14180239.7, Jul. 13, 2015, 20 pages.

* cited by examiner

US 9,343,010 B2

GAMMA REFERENCE VOLTAGE GENERATING CIRCUIT AND DISPLAY DEVICE INCLUDING THE SAME

This application claims the priority benefit of Korean Patent Application No. 10-2013-0169471 filed on Dec. 31, 2013, which is incorporated herein by reference for all purposes as if fully set forth herein.

BACKGROUND OF THE INVENTION

1. Field of the Invention

Embodiments of the invention relate to a gamma reference voltage generating circuit and a display device including the same.

2. Discussion of the Related Art

Various flat panel displays (FPDs), which may replace cathode ray tubes (CRTs) with disadvantageous weight and volume, have been developed. Examples of the flat panel displays include a liquid crystal display (LCD), a field emission display (FED), a plasma display panel (PDP), and an organic light emitting display. Most of the flat panel displays have been put to practical use and have been selling.

In the flat panel displays, the liquid crystal display represents a gray scale by controlling a light transmittance of a liquid crystal layer included in a display panel depending on a magnitude of a driving voltage applied to the display panel. Further, the organic light emitting display represents a gray scale by controlling an amount of current flowing in an organic light emitting diode depending on a magnitude of a driving voltage applied to a display panel.

In general, a gray scale means that an amount of light, which a person perceives through his or her eyes, is divided in stages. According to Weber's law, human eyes respond nonlinearly to brightness of light. Because of this, when a person perceives changes in brightness of light through his/her eye and linearly measures the changes in the brightness of light within a limited bit depth (for example, k-bit) per channel, he/she does not smoothly feel the brightness of light and perceives the intermittent change in the brightness of light. Thus, the brightness of light needs to be nonlinearly decoded, so as to achieve the optimum image quality within the limited bit depth. For this, a process for matching driving characteristics of the display panel and characteristics perceived through human eyes is required. The matching process is called a gamma correction. A gamma correction method generally includes setting a plurality of gamma reference voltages based on the driving characteristics of the display panel, dividing each of the set gamma reference voltages, and compensating for a gamma value of each of input digital video data.

The gamma reference voltages are generated by using voltage followers, which are respectively connected to reference voltages generated by a plurality of digital-to-analog converters (DACs), or by connecting the voltage followers to voltages divided by a resistor string. The voltage followers stabilize the reference voltages and output final gamma reference voltages. The voltage followers implemented as buffers induce an overcurrent due to a difference between slew rates of chips at the moment that the gamma reference voltages are changed.

For example, when a slew rate of a first voltage follower is less than a slew rate of a second voltage follower, a change rate of the voltage in a process for changing a first gamma reference voltage gamma1 and a second gamma reference voltage gamma2 is shown in FIG. 1. Namely, as shown in FIG. 1, because a change rate of the first gamma reference voltage gamma1 is less than a change rate of the second gamma reference voltage gamma2 in a voltage change period Tt, there is a dramatic change in a difference between the first gamma reference voltage gamma1 and the second gamma reference voltage gamma2 at a resistance node between the first and second gamma reference voltages gamma1 and gamma2 Thus, overcurrent is instantaneously generated at a node of an output resistance.

SUMMARY OF THE INVENTION

Embodiments of the invention provide a gamma reference voltage generating circuit and a display device including the same capable of preventing an overcurrent from being generated at an output node of the gamma reference voltage generating circuit.

In one aspect, a gamma reference voltage generating circuit comprises a first voltage follower configured to receive a first reference voltage generated by a first digital-to-analog converter and output a first gamma reference voltage, an nth voltage follower configured to receive a second reference voltage generated by a second digital-to-analog converter and output an nth gamma reference voltage, where n is a natural number equal to or greater than 3, a resistor string configured to divide a voltage difference between the first gamma reference voltage and the nth gamma reference voltage, and second to (n−1)th voltage followers configured to receive the first gamma reference voltage and the nth gamma reference voltage divided by the resistor string and output second to (n−1)th gamma reference voltages.

In another aspect, a gamma reference voltage generating circuit comprises a first voltage follower receiving a first reference voltage from a first digital-to-analog converter and generating a first gamma reference voltage based on the first reference voltage, and a plurality of other voltage followers each generating a gamma reference voltage, where one or more of the gamma reference voltages output from said other voltage followers are generated based on the first gamma reference voltage output from the first voltage follower.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Embodiments of the invention will be described using an organic light emitting display as an example of a display device, to which a gamma reference voltage generating circuit according to the embodiments of the invention is applied. Other display devices, for example, a liquid crystal display may be used.

Figure 1:
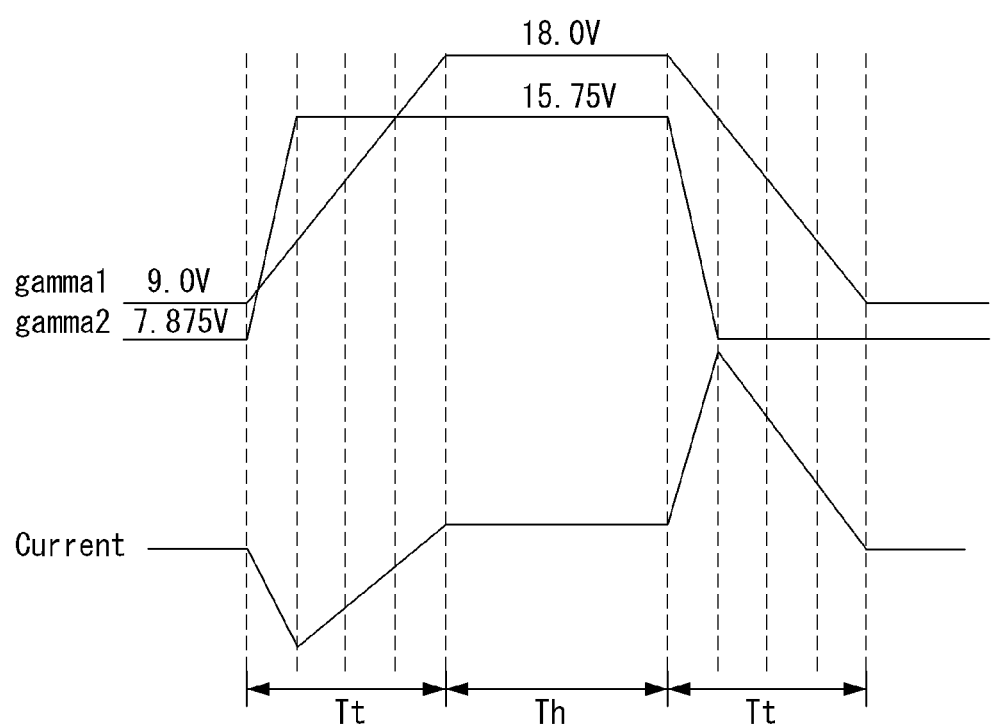
FIG. 1 illustrates a phenomenon, in which an overcurrent is induced in a gamma voltage change period.
Figure 2:
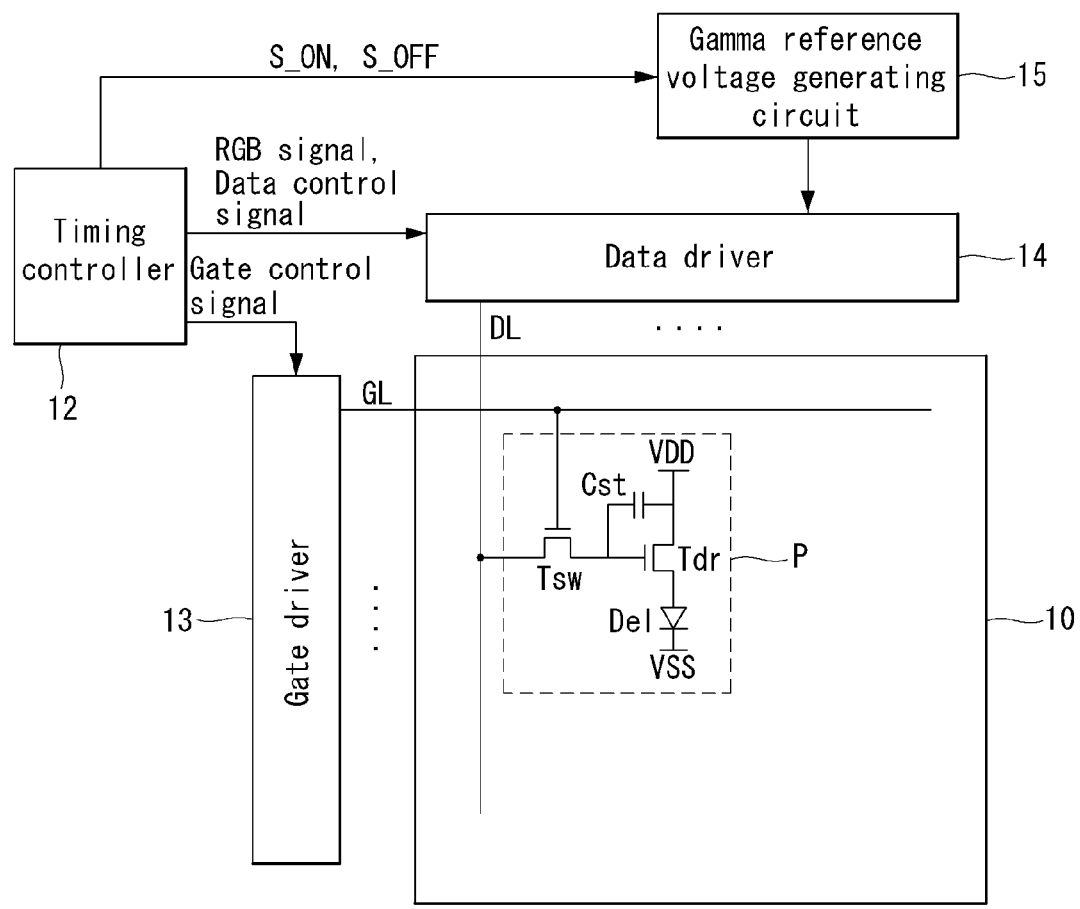
FIG. 2 shows a display device according to an exemplary embodiment of the invention.

FIG. 2 shows an organic light emitting display according to an exemplary embodiment of the invention.

As shown in FIG. 2, the organic light emitting display according to the embodiment of the invention includes a display panel 10, on which a plurality of pixels P are arranged in a matrix form, a data driver 14, a gate driver 13, a timing controller 12, and a gamma reference voltage generating circuit 15.

The display panel 10 includes the plurality of pixels P and displays an image based on a gray scale represented by each pixel P. The pixels P are arranged on each of first to mth horizontal lines of the display panel 10 at uniform distance therebetween and thus are arranged in the matrix form on the display panel 10.

The plurality of pixels P are respectively arranged at crossings between data lines DL and gate lines GL, which cross each other. Each pixel P includes an organic light emitting diode OLED, a driving transistor Tdr, a switching transistor Tsw, and a storage capacitor Cst. The driving transistor Tdr and the switching transistor Tsw may be implemented as an oxide thin film transistor (TFT) including an oxide semiconductor layer. The oxide TFT is advantageous to an increase in the size of the display panel 10 when considering an electron mobility, a process deviation, etc. However, the embodiment of the invention is not limited thereto. For example, the semiconductor layer of the TFT may be formed of amorphous silicon or polycrystalline silicon.

The organic light emitting diode OLED emits light by a driving current received from the driving transistor Tdr. The organic light emitting diode OLED includes an anode electrode, a cathode electrode, and an organic compound layer of a multi-layered structure between the anode electrode and the cathode electrode. The organic compound layer includes a hole injection layer HIL, a hole transport layer HTL, a light emitting layer EML, an electron transport layer ETL, and an electron injection layer EIL. The anode electrode of the organic light emitting diode OLED is connected to a source electrode of the driving transistor Tdr, and the cathode electrode of the organic light emitting diode OLED is connected to a low potential driving voltage VSS.

The driving transistor Tdr controls the driving current applied to the organic light emitting diode OLED using a gate-source voltage of the driving transistor Tdr. For this, a gate electrode of the driving transistor Tdr is connected to an input terminal of a data voltage Vdata, a drain electrode of the driving transistor Tdr is connected to an input terminal of a driving voltage VDD, and the source electrode of the driving transistor Tdr is connected to the low potential driving voltage VSS.

The switching transistor Tsw is connected to the data line DL and the gate line GL. The switching transistor Tsw supplies a data signal to the driving transistor Tdr and the storage capacitor Cst in response to a gate signal received from the gate line GL.

The timing controller 12 controls driving timing of the data driver 14 and driving timing of the gate driver 13. For this, the timing controller 12 rearranges digital video data RGB received from the outside in conformity with a resolution of the display panel 10 and supplies the rearranged digital video data RGB to the data driver 14. The timing controller 12 generates a data control signal DDC for controlling operation timing of the data driver 14 and a gate control signal GDC for controlling operation timing of the gate driver 13 based on timing signals, such as a vertical sync signal Vsync, a horizontal sync signal Hsync, a dot clock DCLK, and a data enable signal DE. Further, the timing controller 12 supplies switch control signals S_ON and S_OFF for controlling operation timings of first and second switches of the gamma reference voltage generating circuit 15 to the gamma reference voltage generating circuit 15.

The data driver 14 drives the data lines DL. For this, the data driver 14 converts the digital video data RGB received from the timing controller 12 into an analog data voltage based on the data control signal DDC and supplies the analog data voltage to the data lines DL. The data driver 14 receives a gamma reference voltage from the gamma reference voltage generating circuit 15 and converts the digital video data RGB into an analog signal.

The gate driver 13 drives the gate lines GL. The gate driver 13 generates the gate signal using the gate control signal GDC received from the timing controller 12. The gate control signal GDC includes a gate start pulse GSP indicating a start scan line, on which a scan operation starts, a gate shift clock GSC for sequentially shifting the gate start pulse GSP, and a gate output enable signal GOE indicating an output of the gate driver 13.

The gamma reference voltage generating circuit 15 outputs first to nth gamma reference voltages gamma1 to gammaN through the voltage division. The gamma reference voltage generating circuit 15 prevents an overcurrent from being generated in a process for changing the first to nth gamma reference voltages gamma1 to gammaN.

Various embodiments of the gamma reference voltage generating circuit 15 are described below.

Figure 3:
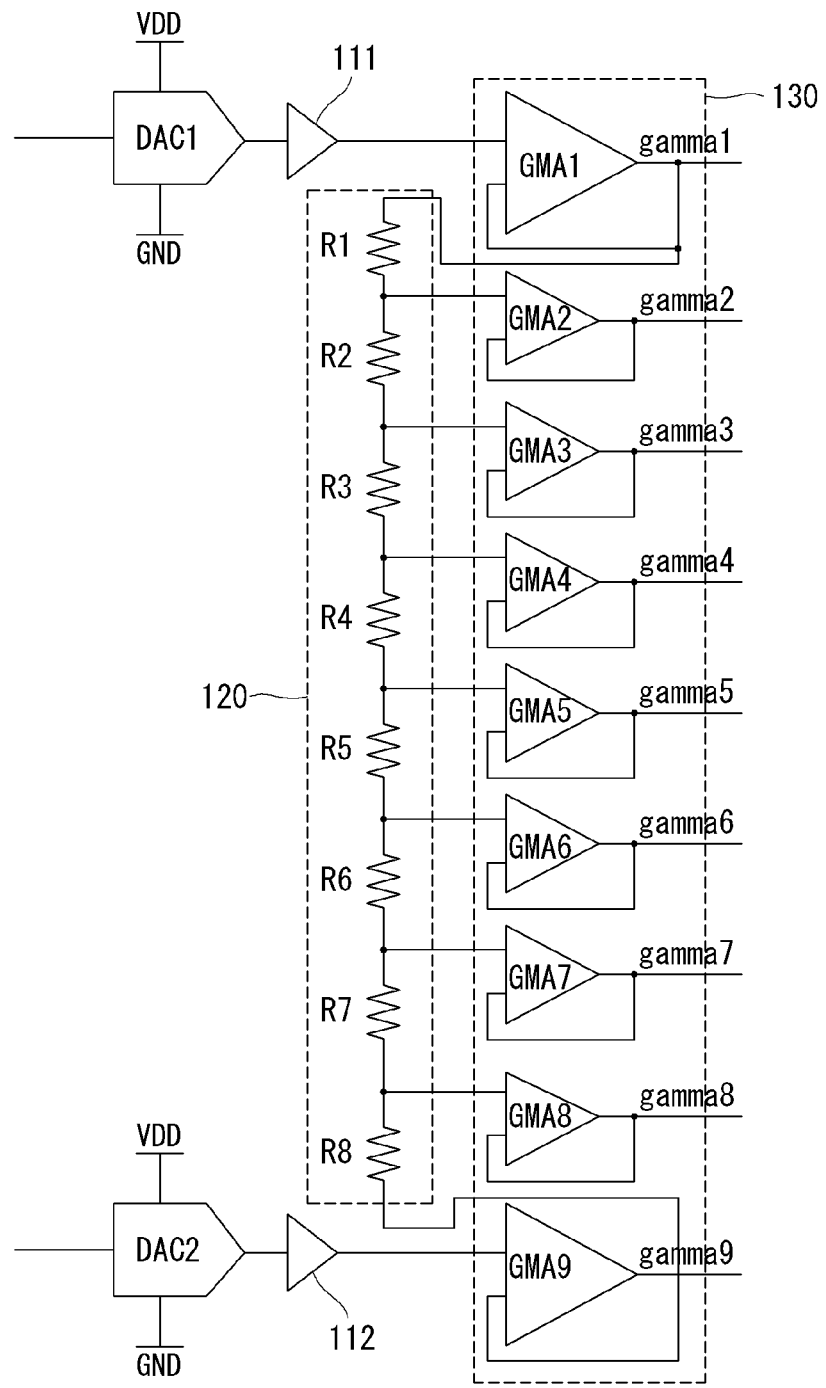
FIG. 3 shows a gamma reference voltage generating circuit according to a first embodiment of the invention.
Figure 4:
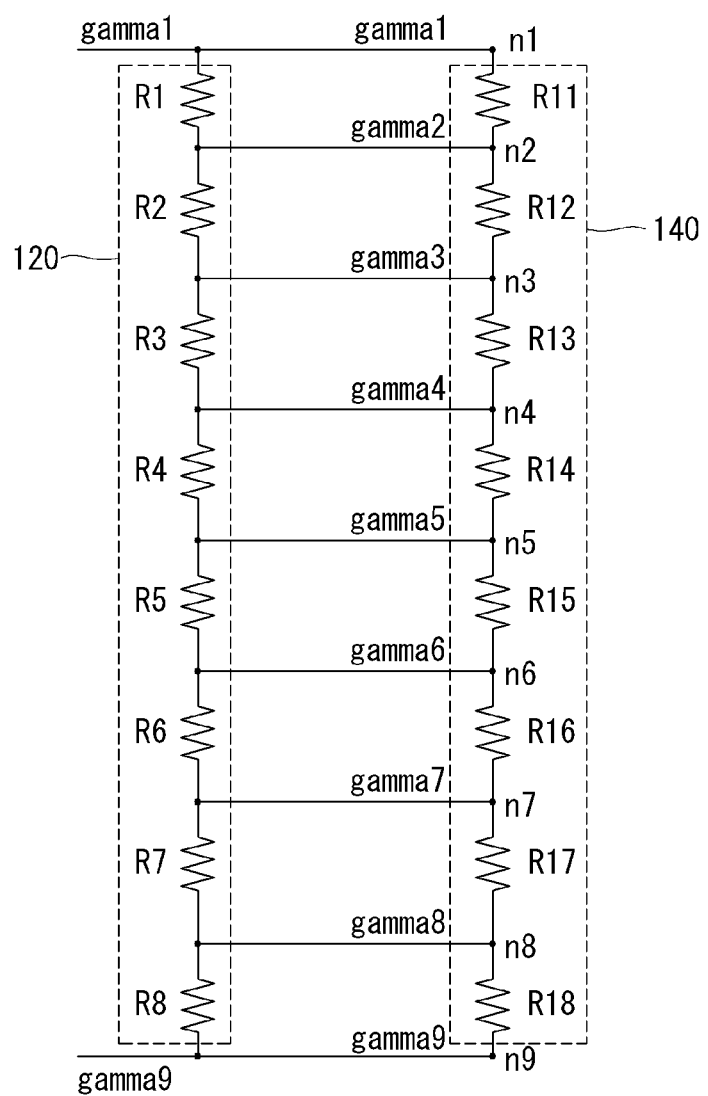
FIG. 4 is an equivalent circuit diagram of a gamma reference voltage generating circuit shown in FIG. 3.

FIG. 3 shows a gamma reference voltage generating circuit according to a first embodiment of the invention. FIG. 4 is an equivalent circuit diagram showing first to ninth gamma reference voltages gamma1 to gamma9 applied to a resistor string 140 of the data driver 14.

As shown in FIGS. 3 and 4, the gamma reference voltage generating circuit according to the first embodiment of the invention includes first and second digital-to-analog converters (DACs) DAC1 and DAC2, first and second current buffers 111 and 112, a gamma buffer unit 130, and a resistor string 120.

The first DAC DAC1 includes an internal resistor string (not shown) and divides a low potential voltage GND and a high potential voltage VDD to output a first reference voltage Vref1. In the same manner as the first DAC DAC1, the second DAC DAC2 outputs a second reference voltage Vref2.

The first current buffer 111 enhances an output current of the first DAC DAC1, and the second current buffer 112 enhances an output current of the second DAC DAC2.

The gamma buffer unit 130 includes first to ninth voltage followers GMA1 to GMA9. The first voltage follower GMA1 is connected to an output terminal of the first DAC DAC1. The first voltage follower GMA1 receives the first reference voltage Vref1 and outputs the first gamma reference voltage gamma1 In this instance, the first gamma reference voltage gamma1 may be a gamma reference voltage for representing an uppermost gray level. The ninth voltage follower GMA9 is connected to an output terminal of the second DAC DAC2. The ninth voltage follower GMA9 receives the second reference voltage Vref2 and outputs the ninth gamma reference voltage gamma9 In this instance, the ninth gamma reference voltage gamma9 may be a gamma reference voltage for representing a lowermost gray level.

The resistor string 120 is formed between the first and ninth voltage followers GMA1 and GMA9 and divides the first gamma reference voltage gamma1 and the ninth gamma reference voltage gamma9 The second to eighth voltage followers GMA2 to GMA8 are respectively connected to nodes between first to eighth resistors R1 to R8.

Figure 5:
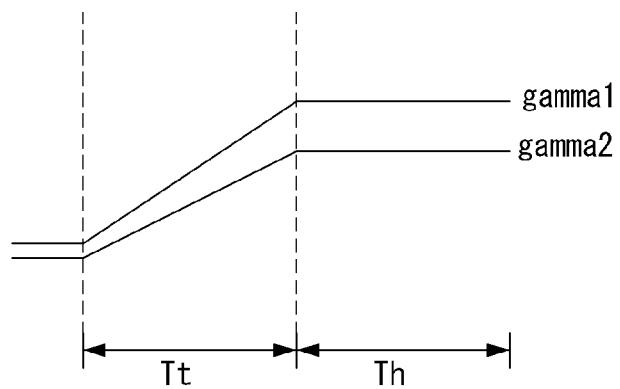
FIG. 5 shows changes in a gamma reference voltage in a voltage change period.

In this instance, as shown in FIG. 5, because the first voltage follower GMA1 has a low slew rate, a change rate of the first gamma reference voltage gamma1 has a slow slope in an output voltage change period Tt. The second gamma reference voltage gamma2 is an output voltage of the second voltage follower GMA2 having a high slew rate, but an input voltage of the second gamma reference voltage gamma2 is an output voltage of the first voltage follower GMA1 having the low slew rate. Therefore, a change rate of the second gamma reference voltage gamma2 is less than the change rate of the first gamma reference voltage gamma1 in the output voltage change period Tt.

Namely, the second gamma reference voltage gamma2 does not reverse a potential of the first gamma reference voltage gamma1 in the output voltage change period Tt, and changes based on changes of the first gamma reference voltage gamma1 Thus, a potential difference between a first node n1 and a second node n2 corresponding to both terminals of a ninth resistor R11 of the data driver 14 is stably maintained even when the first and second gamma reference voltages gamma1 and gamma2 are changed. Therefore, an overcurrent is not induced.

In the same manner as the second gamma reference voltage gamma2, because the eighth gamma reference voltage gamma8 is an output voltage of the eighth voltage follower GMA8 following the ninth gamma reference voltage gamma9, a change rate of the eighth gamma reference voltage gamma8 has a slow slope in the output voltage change period Tt. As a result, the first to ninth gamma reference voltages gamma1 to gamma9 according to the first embodiment of the invention may prevent overcurrent from being induced in ninth to sixteenth resistors R11 to R18 because of a difference between slew rates of the first to ninth voltage followers GMA1 to GMA9.

Figure 6:
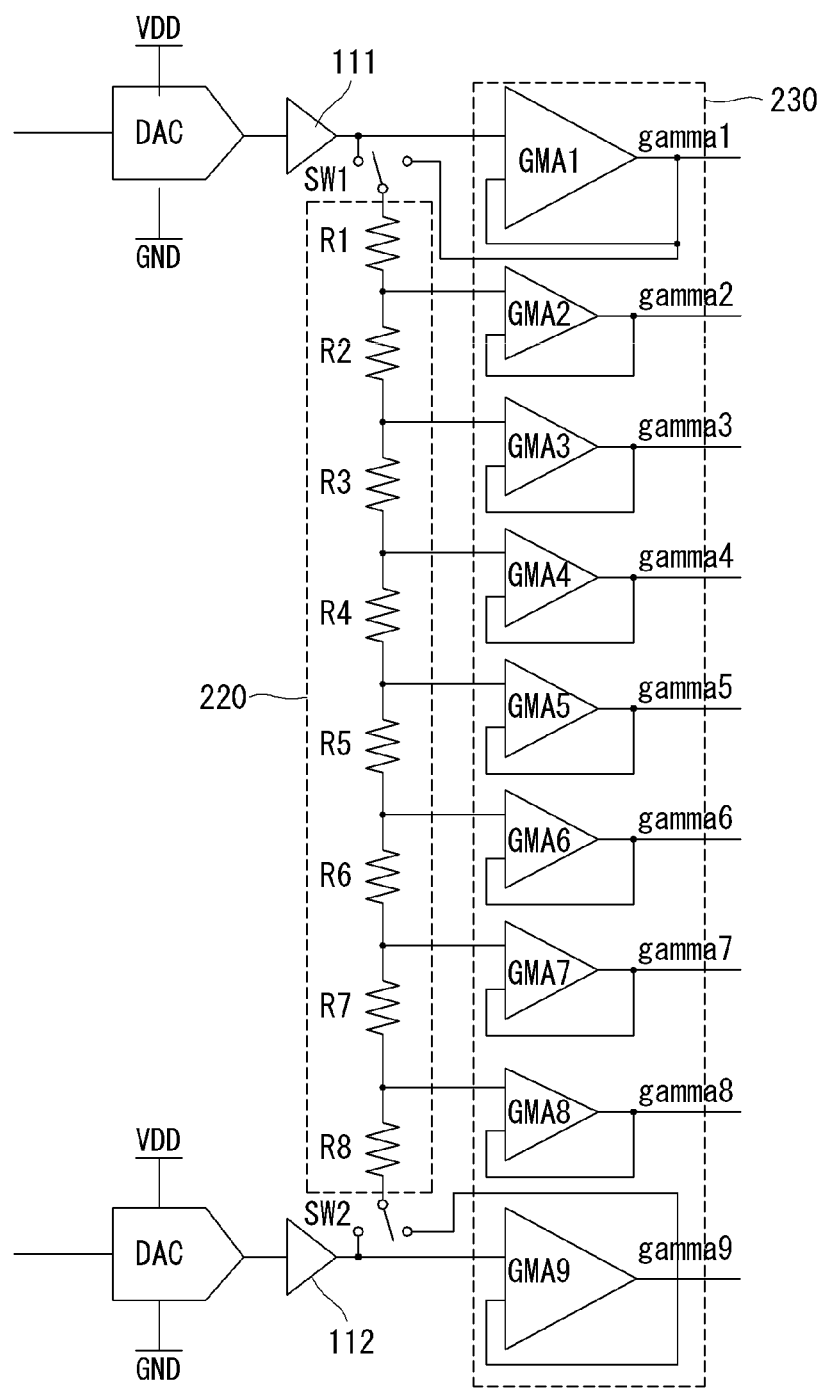
FIG. 6 shows a gamma reference voltage generating circuit according to a second embodiment of the invention.

FIG. 6 shows a gamma reference voltage generating circuit according to a second embodiment of the invention. Structures and components identical or equivalent to those illustrated in the first embodiment are designated with the same reference numerals in the second embodiment of the invention, and a further description may be briefly made or may be entirely omitted.

The gamma reference voltage generating circuit according to the second embodiment of the invention includes first and second DACs DAC1 and DAC2, first and second current buffers 111 and 112, a gamma buffer unit 230, a resistor string 220, and first and second switches SW1 and SW2.

The first switch SW1 is connected to a first resistor R1 of the resistor string 220 and connects the first resistor R1 to an output terminal of a first voltage follower GMA1 or an output terminal of the first DAC DAC1.

The first switch SW1 receives the switch control signals S_ON and S_OFF from the timing controller 12 and determines a connection position of the first resistor R1 in response to the switch control signals S_ON and S_OFF. The first switch SW1 receives the switch-on signal S_ON in an output voltage change period Tt of the first DAC DAC1 and connects the first resistor R1 to the output terminal of the first voltage follower GMA1. Further, the first switch SW1 receives the switch-off signal S_OFF in an output voltage hold period Th of the first DAC DAC1 and connects the first resistor R1 to the output terminal of the first DAC DAC1.

The second switch SW2 is connected to an eighth resistor R8 of the resistor string 220 and connects the eighth resistor R8 to an output terminal of a ninth voltage follower GMA9 or an output terminal of the second DAC DAC2.

The second switch SW2 receives the switch control signals S_ON and S_OFF from the timing controller 12 and determines a connection position of the eighth resistor R8 in response to the switch control signals S_ON and S_OFF. The second switch SW2 receives the switch-on signal S_ON in an output voltage change period Tt of the second DAC DAC2 and connects the eighth resistor R8 to the output terminal of the ninth voltage follower GMA9. Further, the second switch SW2 receives the switch-off signal S_OFF in an output voltage hold period Th of the second DAC DAC2 and connects the eighth resistor R8 to the output terminal of the second DAC DAC2.

Namely, in the output voltage change period Tt, a second voltage follower GMA2 follows an output voltage of the first voltage follower GMA1, and an eighth voltage follower GMA8 follows an output voltage of the ninth voltage follower GMA9. Thus, the gamma reference voltage generating circuit according to the second embodiment of the invention may prevent overcurrent from being induced by a difference between slew rates of the voltage followers GMA1 to GMA9 in the output voltage change period Tt.

In this instance, the output voltage of the first voltage follower GMA1 may include a riffle. When the second voltage follower GMA2 follows the output voltage of the first voltage follower GMA1 including the riffle, all of second to eighth gamma reference voltages gamma2 to gamma8 are affected by the riffle. Thus, in the output voltage hold period Th, the second voltage follower GMA2 follows an output voltage of the first DAC DAC1, and the eighth voltage follower GMA8 follows an output voltage of the second DAC DAC2.

Figure 7:
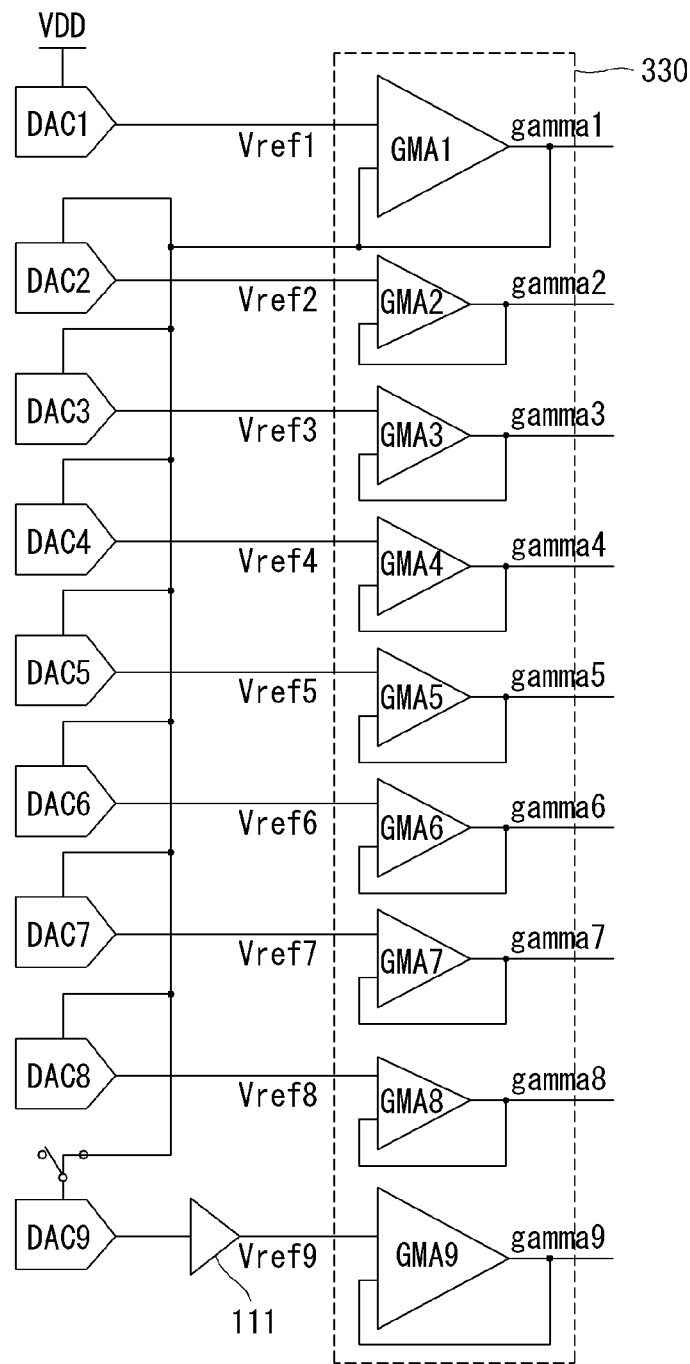
FIG. 7 shows a gamma reference voltage generating circuit according to a third embodiment of the invention.

FIG. 7 shows a gamma reference voltage generating circuit according to a third embodiment of the invention. Structures and components identical or equivalent to those illustrated in the first and second embodiments are designated with the same reference numerals in the third embodiment of the invention, and a further description may be briefly made or may be entirely omitted.

The gamma reference voltage generating circuit according to the third embodiment of the invention includes first to ninth DACs DAC1 to DAC9, a first current buffer 111, and a gamma buffer unit 330.

The first DAC DAC1 divides a low potential voltage GND and a high potential voltage VDD to output a first reference voltage Vref1. The second to ninth DACs DAC2 to DAC9 divide the low potential voltage GND and the first reference voltage Vref1 to respectively output second to ninth reference voltages Vref2 to Vref9.

A first voltage follower GMA1 receives the first reference voltage Vref1 from the first DAC DAC1 and outputs a first gamma reference voltage gamma1 In the same manner as this, second to ninth voltage followers GMA2 to GMA9 respectively output second to ninth gamma reference voltages gamma2 to gamma9.

Because the second DAC DAC2 receives the first gamma reference voltage gamma1 as a high potential bias, the second DAC DAC2 may prevent overcurrent from being induced by a difference between slew rates of the first voltage follower GMA1 and the second voltage follower GMA2. In the same manner as this, because the third to ninth DACs DAC3 to DAC9 receive the first gamma reference voltage gamma1 as the high potential bias, the third to ninth DACs DAC3 to DAC9 may prevent overcurrent from being induced at output nodes.

Figure 8:
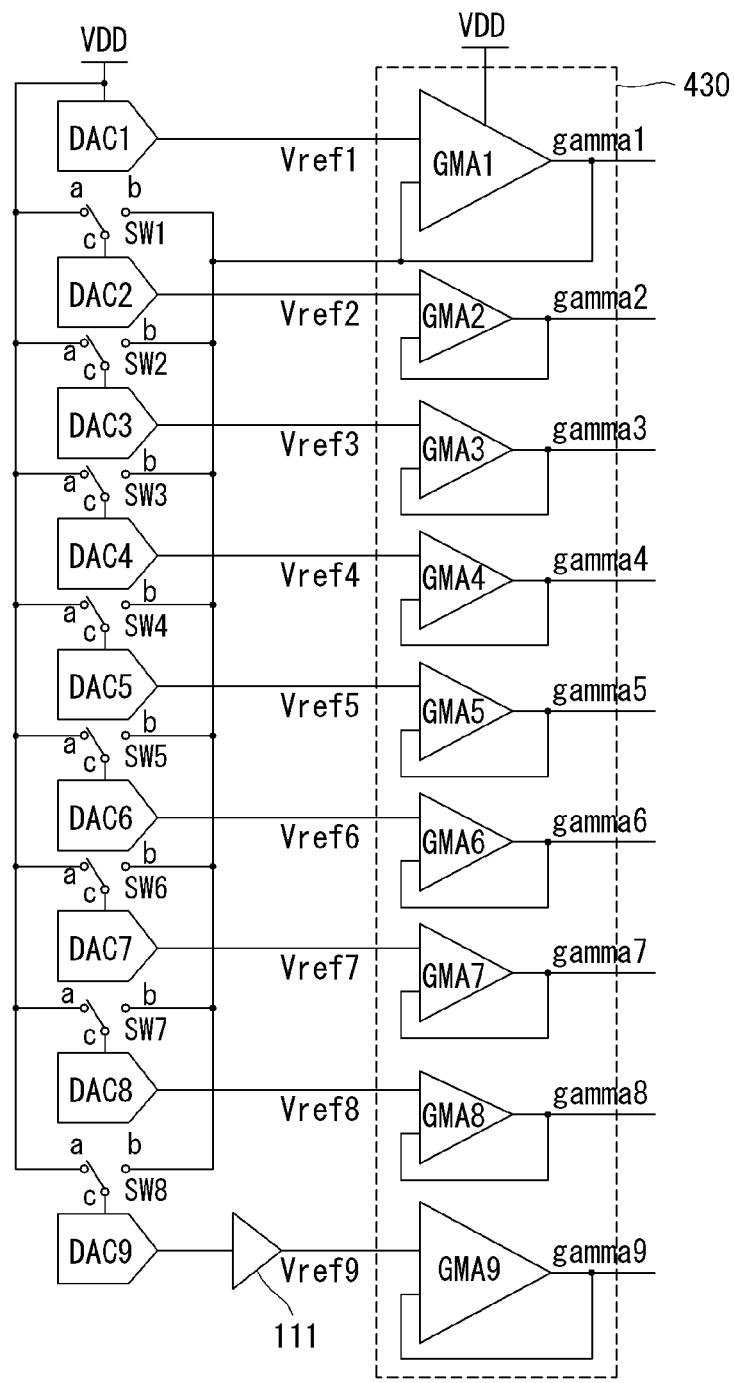
FIG. 8 shows a gamma reference voltage generating circuit according to a fourth embodiment of the invention.

FIG. 8 shows a gamma reference voltage generating circuit according to a fourth embodiment of the invention. Structures and components identical or equivalent to those illustrated in the first to third embodiments are designated with the same reference numerals in the fourth embodiment of the invention, and a further description may be briefly made or may be entirely omitted.

The gamma reference voltage generating circuit according to the fourth embodiment of the invention includes first to ninth DACs DAC1 to DAC9, a first current buffer 111, a gamma buffer unit 430, and first to eighth switches SW1 to SW8.

The first switch SW1 is formed at a high potential bias input terminal 'c' of the second DAC DAC2 and is turned on or off so as to selectively receive a high potential voltage VDD or a first gamma reference voltage gamma1.

Similar to this, the second to eighth switches SW2 to SW8 are respectively formed at high potential bias input terminals 'c' of the third to ninth DACs DAC3 to DAC9 and are turned on or off so as to selectively receive the high potential voltage VDD or the first gamma reference voltage gamma1.

The first to eighth switches SW1 to SW8 receive the switch control signals S_ON and S_OFF from the timing controller 12 and determines voltage supply sources, to which the high potential bias input terminals 'c' are connected. The first to eighth switches SW1 to SW8 receive the switch-on signal S_ON in an output voltage change period Tt, are respectively connected to terminals 'b', and receive the first gamma reference voltage gamma1 Further, the first to eighth switches SW1 to SW8 receive the switch-off signal S_OFF in an output voltage hold period Th, are respectively connected to terminals 'a', and receive the high potential voltage VDD.

Namely, the second to ninth DACs DAC2 to DAC9 follow an output voltage of the first voltage follower GMA1 in the output voltage change period Tt. Thus, the second to ninth DACs DAC2 to DAC9 may prevent overcurrent from being induced by a difference between slew rates of the voltage followers GMA1 to GMA9 in the output voltage change period Tt.

Further, because the second to ninth DACs DAC2 to DAC9 receive the high potential voltage VDD in the output voltage hold period Th, second to ninth gamma reference voltages gamma1 to gamma9 are not affected by a riffle included in the first gamma reference voltage gamma1.

In the embodiment of the invention, voltage followers having a high slew rate follow the output voltage of a voltage follower having a low slew rate and receive the output voltage of the voltage follower having the low slew rate as its input voltage. Therefore, an embodiment of the invention may prevent overcurrent from being induced at the output node by the difference between the slew rates of the voltage followers.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A gamma reference voltage generating circuit comprising:
    a first voltage follower configured to receive a first reference voltage generated by a first digital-to-analog converter and output a first gamma reference voltage;
    an nth voltage follower configured to receive a second reference voltage generated by a second digital-to-analog converter and output an nth gamma reference voltage, where n is a natural number equal to or greater than 3;
    a resistor string configured to generate divided voltages based on the first gamma reference voltage and the nth gamma reference voltage, the resistor string generating the divided voltages by dividing a voltage difference between the first gamma reference voltage and the nth gamma reference voltage; and
    second to (n−1)th voltage followers configured to receive the divided voltages and output second to (n−1)th gamma reference voltages generated based on the divided voltages.

2. The gamma reference voltage generating circuit of claim 1, further comprising:
    a first switch configured to be connected to a first resistor of the resistor string and connect the first resistor to an output terminal of the first voltage follower or an output terminal of the first digital-to-analog converter; and
    a second switch configured to be connected to a mth resistor of the resistor string and connect the mth resistor to an output terminal of the nth voltage follower or an output terminal of the second digital-to-analog converter, where m is (n−1).

3. The gamma reference voltage generating circuit of claim 2, wherein the first switch is connected to the output terminal of the first voltage follower in an output voltage change period of the first digital-to-analog converter and is connected to the output terminal of the first digital-to-analog converter in an output voltage hold period of the first digital-to-analog converter,
    wherein the second switch is connected to the output terminal of the nth voltage follower in an output voltage change period of the second digital-to-analog converter and is connected to the output terminal of the second digital-to-analog converter in an output voltage hold period of the second digital-to-analog converter.

4. The gamma reference voltage generating circuit of claim 1, further comprising:
    a first current buffer connected to an output terminal of the first digital-to-analog converter; and
    a second current buffer connected to an output terminal of the second digital-to-analog converter.

5. A gamma reference voltage generating circuit comprising:
    a first digital-to-analog converter configured to generate a first reference voltage;
    a first voltage follower configured to receive the first reference voltage and output a first gamma reference voltage;
    second to nth digital-to-analog converters configured to generate divided voltages based on the first gamma reference voltage and a low potential voltage by dividing a voltage difference between the low potential voltage and the first gamma reference voltage, the second to nth digital-to-analog converters also configured to generate second to nth reference voltages based on the divided voltages, where n is a natural number equal to or greater than 3; and second to nth voltage followers configured to receive the second to nth reference voltages and output second to nth gamma reference voltages based on the second to nth reference voltages.

6. The gamma reference voltage generating circuit of claim 5, further comprising first to (n−1)th switches which are respectively formed in the second to nth digital-to-analog converters, respectively, wherein the first to (n−1)th switches are turned on or off so as to selectively receive a high potential voltage or an output voltage of the first voltage follower.

7. The gamma reference voltage generating circuit of claim 6, wherein the first to (n−1)th switches are connected to an output terminal of the first voltage follower in an output voltage change period of the first digital-to-analog converter and are connected to an output terminal of the first digital-to-analog converter in an output voltage hold period of the first digital-to-analog converter.

8. A display device comprising:
a gamma reference voltage generating circuit including:
a first voltage follower configured to receive a first reference voltage generated by a first digital-to-analog converter and output a first gamma reference voltage;
an nth voltage follower configured to receive a second reference voltage generated by a second digital-to-analog converter and output an nth gamma reference voltage, where n is a natural number equal to or greater than 3;
a resistor string configured to generate divided voltages based on the first gamma reference voltage and the nth gamma reference voltage, the resistor string generating the divided voltages by dividing a voltage difference between the first gamma reference voltage and the nth gamma reference voltage;
second to (n−1)th voltage followers configured to receive the divided voltages and output second to (n−1)th gamma reference voltages generated based on the divided voltages;
a first switch configured to be connected to a first resistor of the resistor string and connect the first resistor to an output terminal of the first voltage follower or an output terminal of the first digital-to-analog converter; and
a second switch configured to be connected to a mth resistor of the resistor string and connect the mth resistor to an output terminal of the nth voltage follower or an output terminal of the second digital-to-analog converter, where m is (n−1);
a data driver configured to receive the gamma reference voltages, generate a data voltage, and supply the data voltage to a display panel; and
a timing controller configured to control the first switch so that the first resistor is connected to the output terminal of the first voltage follower in an output voltage change period of the first and second digital-to-analog converters, and control the second switch so that the mth resistor is connected to the output terminal of the nth voltage follower in the output voltage change period.

9. The display device of claim 8, wherein the timing controller controls the first switch so that the first resistor is connected to the output terminal of the first digital-to-analog converter in an output voltage hold period of the first and second digital-to-analog converters, and controls the second switch so that the mth resistor is connected to the output terminal of the second digital-to-analog converter in the output voltage hold period.

10. A display device comprising:
a gamma reference voltage generating circuit including:
a first digital-to-analog converter configured to generate a first reference voltage;
a first voltage follower configured to receive the first reference voltage and output a first gamma reference voltage;
second to nth digital-to-analog converters configured to generate divided voltages based on the first gamma reference voltage and a low potential voltage by dividing a voltage difference between the low potential voltage and the first gamma reference voltage, the second to nth digital-to-analog converters also configured to generate second to nth reference voltages based on the divided voltages, where n is a natural number equal to or greater than 3;
second to nth voltage followers configured to receive the second to nth reference voltages and output second to nth gamma reference voltages based on the second to nth reference voltages; and
first to (n−1)th switches which are respectively formed in the second to nth digital-to-analog converters, respectively;
a data driver configured to receive the gamma reference voltages, generate a data voltage, and supply the data voltage to a display panel; and
a timing controller configured to control the first to (n−1)th switches so that the second to nth digital-to-analog converters are connected to an output terminal of the first voltage follower in an output voltage change period of the first digital-to-analog converter.

11. The display device of claim 10, wherein the timing controller controls the first to (n−1)th switches so that the second to nth digital-to-analog converters are connected to the output terminal of the first digital-to-analog converter in the output voltage hold period of the first digital-to-analog converter.

12. A gamma reference voltage generating circuit, comprising:
a first voltage follower receiving a first reference voltage from a first digital-to-analog converter and generating a first gamma reference voltage based on the first reference voltage; and
a plurality of other voltage followers each generating a gamma reference voltage, one or more of the gamma reference voltages output from said other voltage followers being generated based on the first gamma reference voltage output from the first voltage follower.

13. The gamma reference voltage generating circuit of claim 12, wherein a timing of generation of each gamma reference voltage output from said other voltage followers based on a timing of the first gamma reference voltage output from the first voltage follower.

14. The gamma reference voltage generating circuit of claim 12, wherein the first gamma reference voltage is a high-potential gamma reference voltage, and wherein the gamma reference voltage generating circuit further comprises:
a second voltage follower receiving a low-potential reference voltage from a second digital-to-analog converter and generating a second gamma reference voltage based on the low-potential reference voltage; and
a resistor string dividing a voltage difference between the first gamma reference voltage and the second gamma reference voltage, the resistor string outputting respective divided voltages to one or more the plurality of other voltage followers, said one or more of the plurality of other voltage followers generating the gamma reference voltages based on the divided voltages.

15. The gamma reference voltage generating circuit of claim 14, further comprising:
a first switch coupled to a first resistor of the resistor string, the first switch switching a coupling of the first resistor between an output of the first voltage follower and an output of the first digital-to-analog converter to couple the first resistor to the first digital-to-analog converter during an output voltage hold period of the gamma reference voltage generating circuit; and
a second switch coupled to a last resistor of the resistor string, the second switch switching a coupling of the last resistor between an output of a penultimate voltage follower of the plurality of other voltage followers and an output of the second digital-to-analog converter to couple the second-to-last resistor to the second digital-to-analog converter during the output voltage hold period of the gamma reference voltage generating circuit.

16. The gamma reference voltage generating circuit of claim 12, further comprising:
one or more other digital-to-analog converters dividing a voltage difference between the first gamma reference voltage and a low-potential voltage, the plurality of other voltage followers generating the respective gamma reference voltages based on the divided voltage difference.

17. The gamma reference voltage generating circuit of claim 16, further comprising:
a switch coupled to each of the one or more other digital-to-analog converters, each switch switching a coupling of the corresponding digital-to-analog converter between a high potential reference voltage and an output of the first voltage follower such that the switches are coupled to the high potential reference voltage during an output hold period of the gamma reference voltage generating circuit.

* * * * *